(12) United States Patent
Yang et al.

(10) Patent No.: US 9,236,356 B2
(45) Date of Patent: Jan. 12, 2016

(54) SEMICONDUCTOR PACKAGE WITH GROUNDING AND SHIELDING LAYERS

(71) Applicant: ADVANCED SEMICONDUCTOR ENGINEERING, INC., Kaosiung (TW)

(72) Inventors: Jun-Young Yang, Kaohsiung (TW); Sung-Mook Lim, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 14/447,512

(22) Filed: Jul. 30, 2014

(65) Prior Publication Data

US 2015/0035127 A1 Feb. 5, 2015

(30) Foreign Application Priority Data

Jul. 31, 2013 (CN) .......................... 2013 1 0328631

(51) Int. Cl.
*H01L 23/552* (2006.01)
*H01L 23/60* (2006.01)
(Continued)

(52) U.S. Cl.
CPC .............. *H01L 23/60* (2013.01); *H01L 21/561* (2013.01); *H01L 23/49575* (2013.01); *H01L 23/49838* (2013.01); *H01L 23/552* (2013.01); *H01L 24/97* (2013.01); *H01L 23/49816* (2013.01); *H01L 2224/04042* (2013.01); *H01L 2224/06135* (2013.01); *H01L 2224/32225* (2013.01); *H01L 2224/48091* (2013.01); *H01L 2224/48227* (2013.01); *H01L 2224/49175* (2013.01); *H01L 2224/73265* (2013.01); *H01L 2224/97* (2013.01);

(Continued)

(58) Field of Classification Search
CPC ..... H01L 23/556; H01L 23/552; H01L 23/60; H01L 23/3107; H01L 23/49811; H01L 23/49575
USPC ......................................................... 257/660
See application file for complete search history.

(56) References Cited

U.S. PATENT DOCUMENTS 4,569,786 A 2/1986 Deguchi
4,814,205 A 3/1989 Arcilesi et al.
(Continued)

FOREIGN PATENT DOCUMENTS

| CN | 102074551 A | 5/2011 |
| JP | 08-288686 | 1/1996 |
| WO | WO2004060034 | 7/2004 |

OTHER PUBLICATIONS

U.S. Appl. No. 12/432,621, filed Apr. 29, 2009, An et al.
(Continued)

*Primary Examiner* — Nathan Ha
(74) *Attorney, Agent, or Firm* — Foley & Lardner LLP; Cliff Z. Liu; Angela D. Murch

(57) ABSTRACT

A semiconductor package includes a substrate, a grounding layer, a chip, a package body, and a shielding layer. The substrate includes a lateral surface and a bottom surface. The grounding layer is buried in the substrate and extends horizontally in the substrate. The chip is arranged on the substrate. The package body envelops the chip and includes a lateral surface. The shielding layer covers the lateral surface of the package body and the lateral surface of the substrate, and is electrically connected to the grounding layer, where a bottom surface of the shielding layer is separated from a bottom surface of the substrate.

17 Claims, 12 Drawing Sheets

(51) Int. Cl.
*H01L 23/495* (2006.01)
*H01L 21/56* (2006.01)
*H01L 23/00* (2006.01)
*H01L 23/498* (2006.01)

(52) U.S. Cl.
CPC ............... *H01L 2924/15159* (2013.01); *H01L 2924/15184* (2013.01); *H01L 2924/15311* (2013.01)

(56) References Cited

U.S. PATENT DOCUMENTS

| | | |
|---|---|---|
| 5,166,772 A | 11/1992 | Soldner et al. |
| 5,353,498 A | 10/1994 | Fillion et al. |
| 5,355,016 A | 10/1994 | Swirbel et al. |
| 5,557,142 A | 9/1996 | Gilmore et al. |
| 5,639,989 A | 6/1997 | Higgins, III |
| 5,677,511 A | 10/1997 | Taylor et al. |
| 5,694,300 A | 12/1997 | Mattei et al. |
| 5,776,798 A | 7/1998 | Quan et al. |
| 5,886,876 A | 3/1999 | Yamaguchi |
| 5,895,229 A | 4/1999 | Carney et al. |
| 5,998,867 A | 12/1999 | Jensen et al. |
| 6,093,972 A | 7/2000 | Carney et al. |
| 6,150,193 A | 11/2000 | Glenn |
| 6,225,694 B1 | 5/2001 | Terui |
| 6,376,769 B1 | 4/2002 | Chung |
| 6,586,822 B1 | 7/2003 | Vu et al. |
| 6,614,102 B1 | 9/2003 | Hoffman et al. |
| 6,740,546 B2 | 5/2004 | Corisis et al. |
| 6,740,959 B2 | 5/2004 | Alcoe et al. |
| 6,757,181 B1 | 6/2004 | Villanueva |
| 6,781,231 B2 | 8/2004 | Minervini |
| 6,838,776 B2 | 1/2005 | Leal et al. |
| 6,865,084 B2 | 3/2005 | Lin et al. |
| 6,881,896 B2 | 4/2005 | Ebihara |
| 6,962,869 B1 | 11/2005 | Bao et al. |
| 6,998,532 B2 | 2/2006 | Kawamoto et al. |
| 7,030,469 B2 | 4/2006 | Mahadevan et al. |
| 7,045,385 B2 | 5/2006 | Kim et al. |
| 7,081,661 B2 | 7/2006 | Takehara et al. |
| 7,125,744 B2 | 10/2006 | Takehara et al. |
| 7,161,252 B2 | 1/2007 | Tsuneoka et al. |
| 7,186,928 B2 | 3/2007 | Kikuchi et al. |
| 7,187,060 B2 | 3/2007 | Usui |
| 7,327,015 B2 | 2/2008 | Yang et al. |
| 7,342,303 B1 | 3/2008 | Berry et al. |
| 7,451,539 B2 | 11/2008 | Morris et al. |
| 7,478,474 B2 | 1/2009 | Koga |
| 7,488,903 B2 | 2/2009 | Kawagishi et al. |
| 7,576,415 B2 | 8/2009 | Cha et al. |
| 7,629,674 B1 | 12/2009 | Foster |
| 7,633,170 B2 | 12/2009 | Yang et al. |
| 7,633,765 B1 | 12/2009 | Scanlan et al. |
| 7,656,047 B2 | 2/2010 | Yang et al. |
| 7,700,411 B2 | 4/2010 | Yang et al. |
| 7,745,910 B1 | 6/2010 | Olson et al. |
| 7,829,981 B2 | 11/2010 | Hsu |
| 8,093,691 B1 * | 1/2012 | Fuentes et al. ............... 257/660 |
| 8,368,185 B2 * | 2/2013 | Lee et al. ..................... 257/659 |
| 8,508,023 B1 * | 8/2013 | Kelly et al. .................. 257/659 |
| 8,809,694 B2 * | 8/2014 | Yoshida ........................ 174/260 |
| 8,810,011 B2 * | 8/2014 | Pagaila ........................ 257/660 |
| 8,829,667 B2 * | 9/2014 | Park et al. ................... 257/692 |
| 8,937,370 B2 * | 1/2015 | Song et al. .................. 257/659 |
| 2004/0020673 A1 | 2/2004 | Mazurkiewicz |
| 2004/0150097 A1 | 8/2004 | Gaynes et al. |
| 2004/0178500 A1 | 9/2004 | Usui |
| 2004/0231872 A1 | 11/2004 | Arnold et al. |
| 2004/0252475 A1 | 12/2004 | Tsuneoka et al. |
| 2005/0013082 A1 | 1/2005 | Kawamoto et al. |
| 2005/0029673 A1 | 2/2005 | Naka et al. |
| 2005/0039946 A1 | 2/2005 | Nakao |
| 2005/0045358 A1 | 3/2005 | Arnold |
| 2005/0208702 A1 | 9/2005 | Kim |
| 2006/0145361 A1 | 7/2006 | Yang et al. |
| 2006/0266547 A1 * | 11/2006 | Koga ............................ 174/255 |
| 2008/0042301 A1 | 2/2008 | Yang et al. |
| 2008/0061407 A1 | 3/2008 | Yang et al. |
| 2008/0174013 A1 | 7/2008 | Yang et al. |
| 2009/0000114 A1 | 1/2009 | Rao et al. |
| 2009/0000815 A1 | 1/2009 | Hiner et al. |
| 2009/0000816 A1 | 1/2009 | Hiner et al. |
| 2009/0002969 A1 | 1/2009 | Madsen et al. |
| 2009/0002970 A1 | 1/2009 | Leahy et al. |
| 2009/0002971 A1 | 1/2009 | Carey et al. |
| 2009/0002972 A1 | 1/2009 | Carey et al. |
| 2009/0025211 A1 | 1/2009 | Hiner et al. |
| 2009/0035895 A1 | 2/2009 | Lee et al. |
| 2009/0102003 A1 | 4/2009 | Vogt et al. |
| 2009/0102033 A1 | 4/2009 | Raben |
| 2009/0194851 A1 | 8/2009 | Chiu et al. |
| 2009/0194852 A1 | 8/2009 | Chiu et al. |
| 2009/0230487 A1 | 9/2009 | Saitoh et al. |
| 2009/0230523 A1 | 9/2009 | Chien et al. |
| 2009/0230524 A1 | 9/2009 | Chien et al. |
| 2009/0230525 A1 | 9/2009 | Chien et al. |
| 2009/0230526 A1 | 9/2009 | Chen et al. |
| 2009/0236700 A1 | 9/2009 | Moriya |
| 2009/0256244 A1 | 10/2009 | Liao et al. |
| 2010/0006330 A1 | 1/2010 | Fu et al. |
| 2010/0013064 A1 | 1/2010 | Hsu |
| 2010/0032815 A1 | 2/2010 | An et al. |
| 2010/0109132 A1 | 5/2010 | Ko et al. |
| 2010/0110656 A1 | 5/2010 | Ko et al. |
| 2010/0199492 A1 | 8/2010 | Hiner et al. |
| 2010/0207257 A1 | 8/2010 | Lee |
| 2010/0207258 A1 | 8/2010 | Eun et al. |
| 2010/0207259 A1 | 8/2010 | Liao et al. |
| 2011/0006408 A1 * | 1/2011 | Liao ............................. 257/660 |
| 2011/0115060 A1 * | 5/2011 | Chiu et al. .................... 257/660 |
| 2011/0298111 A1 * | 12/2011 | Kim ............................. 257/660 |
| 2013/0292808 A1 * | 11/2013 | Yen et al. ..................... 257/660 |

OTHER PUBLICATIONS

U.S. Appl. No. 12/622,419, filed Nov. 19, 2009, Lee et al.
U.S. Appl. No. 12/622,415, filed Nov. 19, 2009, Kim et al.
U.S. Appl. No. 12/622,393, filed Nov. 19, 2009, Chiu et al.
U.S. Appl. No. 12/955,782, filed Nov. 29, 2010, Weng et al.
Huang et al., "Conformal Shielding Investigation for SiP Modules." 2010 IEEE Electrical Design of Advanced Package & Systems Symposium(EDAPS 2010) filed Dec. 7-9, 2010.
Office Action and Search Report on Chinese Application No. 201310328631.1 dated Jun. 26, 2015, 10 pages.

* cited by examiner

SEMICONDUCTOR PACKAGE WITH GROUNDING AND SHIELDING LAYERS

CROSS-REFERENCE TO RELATED APPLICATION

This application claims the benefit of Chinese Patent Application No. 201310328631.1, filed on Jul. 31, 2013, the content of which is incorporated herein by reference in its entirety.

BACKGROUND

1. Technical Field

The present disclosure relates to a semiconductor package and a method of fabricating the same, and more particularly to a semiconductor package including a grounding layer extending horizontally and a method of fabricating the same.

2. Description of the Related Art

To meet demands in terms of process speed and size reduction, semiconductor elements become very complex. As the process speed increases and improvements in efficiency of small sizes are realized, semiconductor elements also encounter problems in characteristics. Especially, operations at a high clock speed result in more frequent transitions between signal levels, and therefore result in high-intensity electromagnetic emission at high frequencies or short wavelengths. The electromagnetic emission may be radiated from a semiconductor element that is adjacent to another semiconductor element. If the adjacent semiconductor element has a high intensity of electromagnetic emission, the electromagnetic emission adversely affects the operation of the other semiconductor element. If semiconductor elements are distributed with higher density in an entire electronic system, electromagnetic interference between semiconductor elements becomes more severe.

Therefore, it is desirable to reduce electromagnetic interference in the technical field and industry.

SUMMARY

The present disclosure relates to a semiconductor package and a method of fabricating the same, which can reduce adverse influence on a semiconductor package caused by electromagnetic interference.

According to an embodiment of the present disclosure, a semiconductor package is proposed. The semiconductor package includes a substrate, a grounding layer, a chip, a package body, and a shielding layer. The substrate includes a lateral surface and a bottom surface. The grounding layer is buried in the substrate and extends horizontally in the substrate. The chip is arranged on the substrate. The package body envelops the chip and includes a lateral surface. The shielding layer covers the lateral surface of the package body and the lateral surface of the substrate, and is electrically connected to the grounding layer, wherein a bottom surface of the shielding layer is separated from the bottom surface of the substrate.

According to another embodiment of the present disclosure, a semiconductor package is proposed. The semiconductor package includes a substrate, a grounding layer, a grounding trace, a chip, a package body, and a shielding layer. The substrate includes a lateral surface. The grounding layer is included in the substrate, the grounding layer extending horizontally and being separated from the lateral surface of the substrate. The grounding trace is included in the substrate and extends from the grounding layer to the lateral surface of the substrate, wherein the grounding trace is exposed on the lateral surface of the substrate, and a width of the grounding trace is smaller than a width of the grounding layer. The chip is arranged on the substrate. The package body envelops the chip and includes a lateral surface. The shielding layer covers the lateral surface of the package body, the lateral surface of the substrate, and the exposed grounding trace.

According to another embodiment of the present disclosure, a method of fabricating a semiconductor package is proposed. The method includes the following operations: providing a substrate, the substrate including a bottom surface and a horizontally extending grounding layer that is buried in the substrate; arranging a chip on the substrate; forming a package body enveloping the chip; forming a first scribe line through the package body, a part of the substrate, and the grounding layer so as to form a lateral surface for each of the package body and the substrate, where the grounding layer is exposed on the lateral surface of the substrate; forming a shielding layer covering the lateral surface of the package body, the lateral surface of the substrate, and the exposed grounding layer; and forming a second scribe line through a remaining part of the substrate to cut through the substrate and to form a bottom surface of the shielding layer, where the bottom surface of the shielding layer is separated from the bottom surface of the substrate.

To further explain the foregoing content of the present disclosure, detailed illustration is provided below with reference to the embodiments and accompanying drawings.

BRIEF DESCRIPTION OF THE DRAWINGS

The disclosure will be described according to the appended drawings in which.

DETAILED DESCRIPTION

Figure 1A:
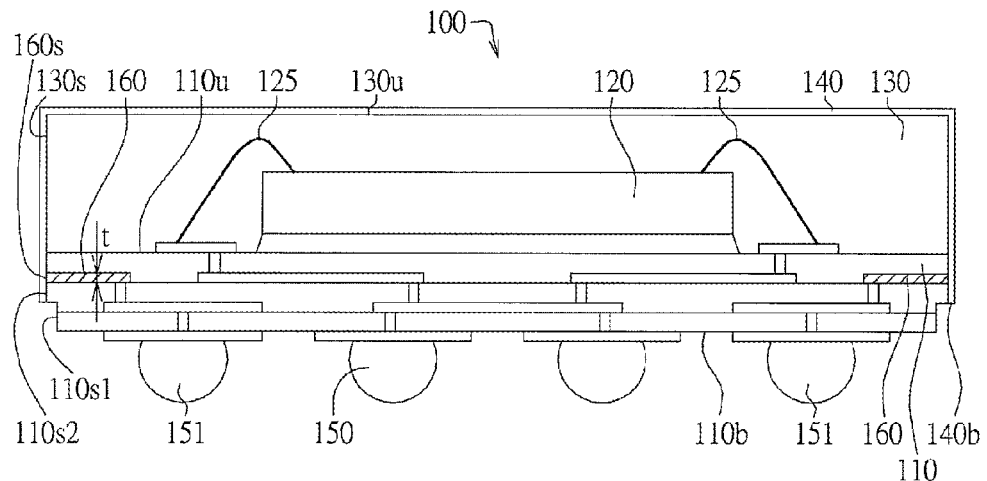
FIG. 1A is a sectional view of a semiconductor package according to an embodiment of the present disclosure.

FIG. 1A is a sectional view of a semiconductor package according to an embodiment of the present disclosure. A semiconductor package 100 includes a substrate 110, a chip 120, at least one bonding wire 125, a package body 130, a shielding layer 140, at least one electrical contact 150, and at least one grounding layer 160.

The substrate 110 is, for example, a single-layer or multiple-layer substrate, and in this embodiment a multiple-layer substrate is used as an example for illustration. The substrate 110 includes a first lateral surface 110s1 and a second lateral surface 110s2. The first lateral surface 110s1 and the second lateral surface 110s2 are formed in two different cutting operations, and therefore the second lateral surface 110s2 is horizontally kept or separated at a distance away from the first lateral surface 110s1. In this example, the first lateral surface 110s1 is concave or inwardly recessed relative to the second lateral surface 110s2.

In this example, because the second lateral surface 110s2 of the substrate 110, a lateral surface 130s of the package body 130, and a lateral surface 160s of the grounding layer 160 are formed in the same cutting operation, the lateral surfaces 110s2, 130s, and 160s are aligned, for example, approximately aligned or flush.

The chip 120 is arranged on an upper surface 110u of the substrate 110 with an active surface of the chip 120 facing upwards and is electrically connected to the substrate 110 through the at least one bonding wire 125. In another embodiment, the chip 120 may be arranged on the upper surface 110u of the substrate 110 with the active surface of the chip 120 facing downwards and is electrically connected to the substrate 110 through at least one solder ball; this kind of the chip 120 is referred to as a flip chip.

The package body 130 covers the upper surface 110u of the substrate 110 and envelops or encapsulates the chip 120 and the bonding wire 125. The package body 130 may include, for example, novolac-based resin, epoxy-based resin, silicone-based resin or other suitable enveloping agents. The package body 130 may also include a suitable filling agent, for example, silicon diode in a powder form. Several encapsulation technologies, for example, compression molding, liquid encapsulation, injection molding or transfer molding, may be used to form the package body 130.

The shielding layer 140 covers an upper surface 130u and the lateral surface 130s of the package body 130, the second lateral surface 110s2 of the substrate 110, and the grounding layer 160 exposed from, or on, the second lateral surface 110s2. In this example, the shielding layer 140 does not extend along, or does not cover, the first lateral surface 110s1. Because the first lateral surface 110s1 of the substrate 110 is concave relative to the second lateral surface 110s2, a bottom surface 140b of the shielding layer 140 is separated by a distance from a bottom surface 110b of the substrate 110; in this manner, a probability of a short circuit between the shielding layer 140 and the electrical contact 150 and an external circuit element (for example, a circuit board, a chip or a semiconductor package) may be reduced.

The material of the shielding layer 140 is, for example, aluminum, copper, chromium, tin, gold, silver, nickel, stainless steel or a combination of the foregoing materials, and the shielding layer 140 may be formed by coating or deposition technologies such as chemical vapor deposition (CVD), electroless plating, electroplating, printing, spinning, spraying, sputtering or vacuum deposition.

The shielding layer 140 may be a single-layer or multiple-layer structure, with the same or different materials in different layers. For example, the shielding layer 140 is a three-layer structure, in which an inner layer is a stainless steel layer, an intermediate layer is a copper layer, and an outer layer is a stainless steel layer; or, the shielding layer 140 is a double-layer structure, in which an inner layer is a copper layer, and an outer layer is a stainless steel layer.

The electrical contact 150 is, for example, a solder ball, a bump or a conductive post, and in this example, a solder ball is used as an example for illustration. The electrical contact 150 includes at least one grounding contact 151, which may be electrically connected to an external grounding (not shown); the external grounding is, for example, a circuit board, a chip or a semiconductor package, so that the grounding layer 160 is grounded through the grounding contact 151, and further the shielding layer 140 is grounded through the grounding layer 160, so as to protect electronic elements inside the semiconductor package 100 from electromagnetic interference.

In this embodiment, the grounding layer 160 is buried in the substrate 110, that is, the grounding layer 160 is arranged on an upper surface of an inner, second layer of the substrate 110, and therefore the grounding layer 160 is not exposed from, or on, the upper surface 110u or the bottom surface 110b of the substrate 110. In another embodiment, the grounding layer 160 may be arranged on an upper surface of another layer of the substrate 110. A single layer is used for the grounding layer in this embodiment as an example for illustration; however, in another embodiment, there may be multiple grounding layers 160. The grounding layer 160 extends horizontally to the second lateral surface 110s2 of the substrate 110 to be exposed from, or on, the second lateral surface 110s2 of the substrate 110, so that the shielding layer 140 can contact the exposed grounding layer 160. In addition, a vertical thickness t of the grounding layer 160 may be between about 5 micrometers and about 50 micrometers, such as between about 5 micrometers and about 20 micrometers or between about 20 micrometers and about 50 micrometers. In an embodiment, the grounding layer 160 may be formed through electroplating.

Compared with an electrical connection to the shielding layer 140 using a conductive post, the size of the grounding layer 160 in this embodiment is reduced, and therefore an occupancy of an edge area of the substrate 110 is reduced, so that the area of the semiconductor package 100 may be reduced.

Figure 1B:
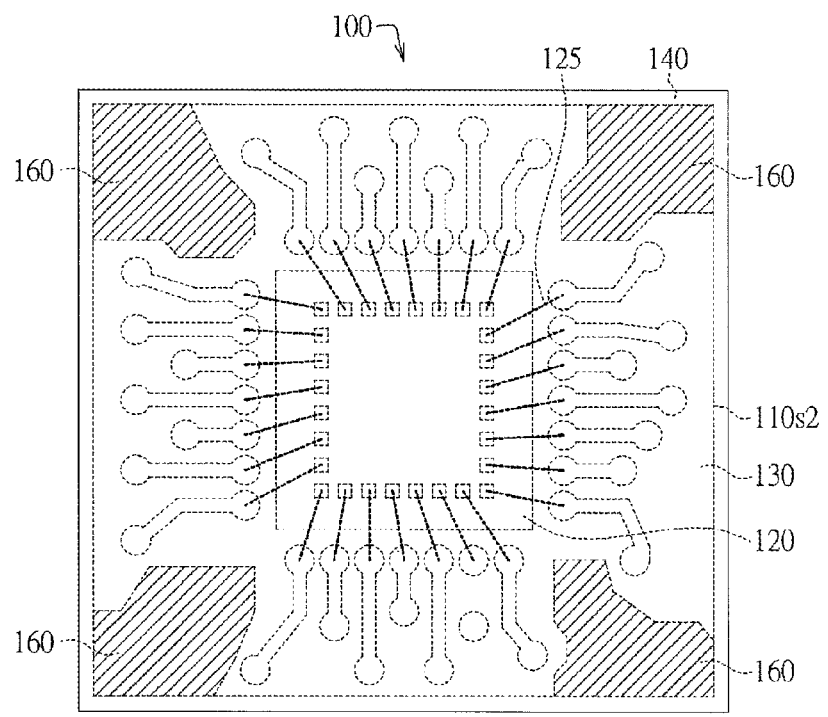
FIG. 1B is a top view of FIG. 1A.

FIG. 1B is a top view of FIG. 1A. In this embodiment, the grounding layer 160 directly extends to the second lateral surface 110s2 of the substrate 110 without requiring any trace. In an embodiment, a horizontal area of the grounding layer 160 occupies about 5% to about 50% of a horizontal area of the substrate, such as about 5% to about 20% or about 20% to about 50%, allowing the grounding layer 160 to achieve a desirable electromagnetic protection effect. In addition, the shape of the grounding layer 160 is not limited in the embodiment of the present disclosure, and may be circular, elliptical, rectangular or even irregular. An extending region of the grounding layer 160 is also not limited in the embodiment of the present disclosure. In an embodiment, the grounding layer 160 may extend along the entire second lateral surface 110s2 of the substrate 110 to form an enclosed ring, thereby enhancing a shielding effect from electromagnetic interference.

Figure 2:
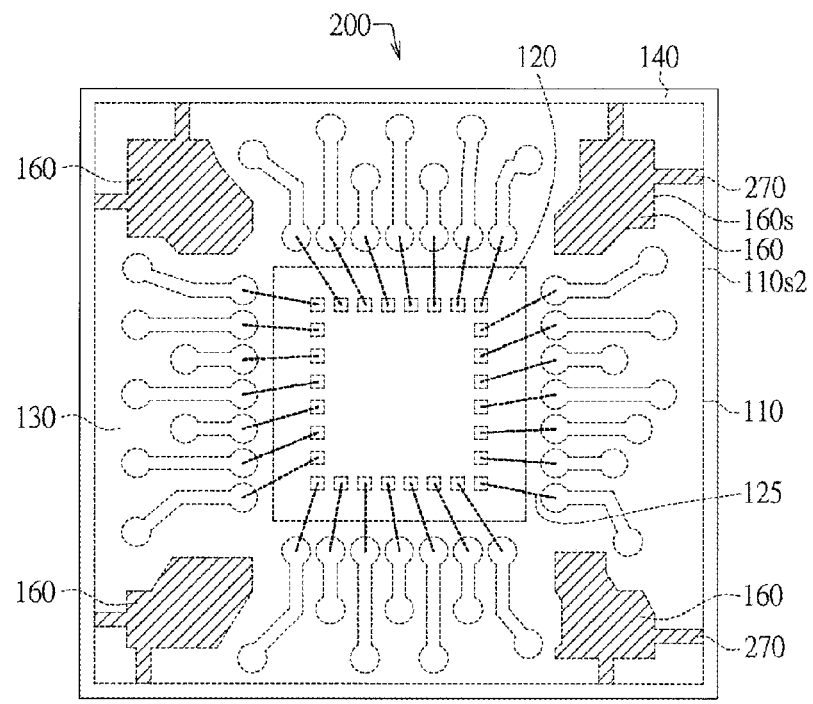
FIG. 2 is a top view of a semiconductor package according to another embodiment of the present disclosure.

FIG. 2 is a top view of a semiconductor package according to another embodiment of the present disclosure. A semiconductor package 200 includes a substrate 110, a chip 120, at least one bonding wire 125, a package body 130, a shielding layer 140, at least one electrical contact 150 (not shown), at least one grounding layer 160, and at least one grounding trace 270.

Different from the semiconductor package 100 in FIG. 1A, in this embodiment, the grounding layer 160 is separated by a distance from a second lateral surface 110s2 of the substrate 110, and the grounding layer 160 is connected to the second lateral surface 110s2 through the grounding trace 270, so that the grounding layer 160 is electrically connected to the shielding layer 140 through the grounding trace 270. That is, a lateral surface 160s of the grounding layer 160 is not flush with the second lateral surface 110s2 of the substrate 110, and instead, is connected to the shielding layer 140 through the at least one grounding trace 270. A width or a line diameter of the grounding trace 270 is smaller than a width of the grounding layer 160, and therefore a sum of horizontal areas of the grounding layer 160 and the grounding trace 270 occupies about 5% to about 75% of a horizontal area of the substrate 110, such as about 5% to about 20%, about 20% to about 50%, or about 50% to about 75%, so as to produce a desirable electromagnetic protection effect between the grounding layer 160 and the grounding trace 270.

Figure 3A:
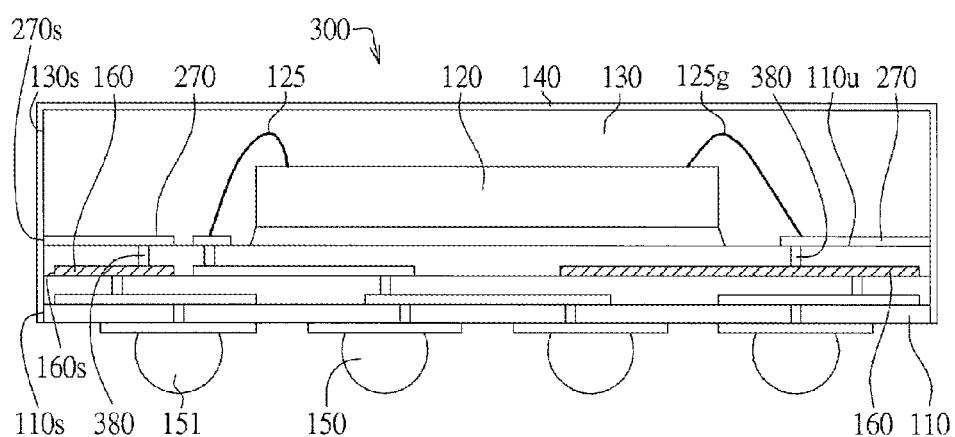
FIG. 3A is a sectional view of a semiconductor package according to another embodiment of the present disclosure.

FIG. 3A is a sectional view of a semiconductor package according to another embodiment of the present disclosure. A semiconductor package 300 includes a substrate 110, a chip 120, at least one bonding wire 125, a package body 130, a shielding layer 140, at least one electrical contact 150, at least one grounding layer 160, at least one grounding trace 270, and at least one via 380.

In this example, the substrate 110, the package body 130, and the grounding trace 270 have lateral surfaces 110s, 130s, and 270s, respectively; because all the lateral surfaces 110s, 130s, and 270s are formed in the same cutting operation, all the lateral surfaces 110s, 130s, and 270s are aligned, for example, approximately aligned or flush.

Although the grounding layer 160 is separated from the lateral surface 110s of the substrate 110, the grounding trace 270 extends to the lateral surface 110s of the substrate 110 to contact the shielding layer 140, so that the shielding layer 140 is grounded through the grounding trace 270, the via 380, the grounding layer 160, and the grounding contact 151. In another embodiment, the grounding layer 160 may also extend to the lateral surface 110s of the substrate 110 to contact the shielding layer 140, but at the same time is still connected to the shielding layer 140 through the via 380 and the grounding trace 270.

In some embodiments, the horizontal area of the grounding layer 160 occupies almost or substantially the whole horizontal area of the substrate 110. In some embodiments as illustrated in FIGS. 1B and 2, the grounding layer merely occupies about 5% to about 50% of a horizontal area of the substrate 110, which means conductive material (such as copper or another metal) used to form the grounding layer 160 can be reduced, and the unoccupied areas of the substrate 110 may further be used to accommodate more elements (e.g., vias, traces, passive elements and the like) so as to facilitate the subsequent layout or circuit design process. Other advantages resulting from such arrangement may include heat dissipation and less electromagnetic interference (in high-frequency environment) because of the longer distance and greater space between the electrical elements provided by the unoccupied areas.

As shown in FIG. 3A, the grounding trace 270 in this embodiment is configured on a layer that is different from a layer on which the grounding layer 160 is configured in the substrate 110. For example, the grounding trace 270 is formed on an upper surface 110u of the substrate 110, the grounding layer 160 is buried in the substrate 110, and the grounding trace 270 is electrically connected to the grounding layer 160 through the at least one via 380.

Figure 3B:
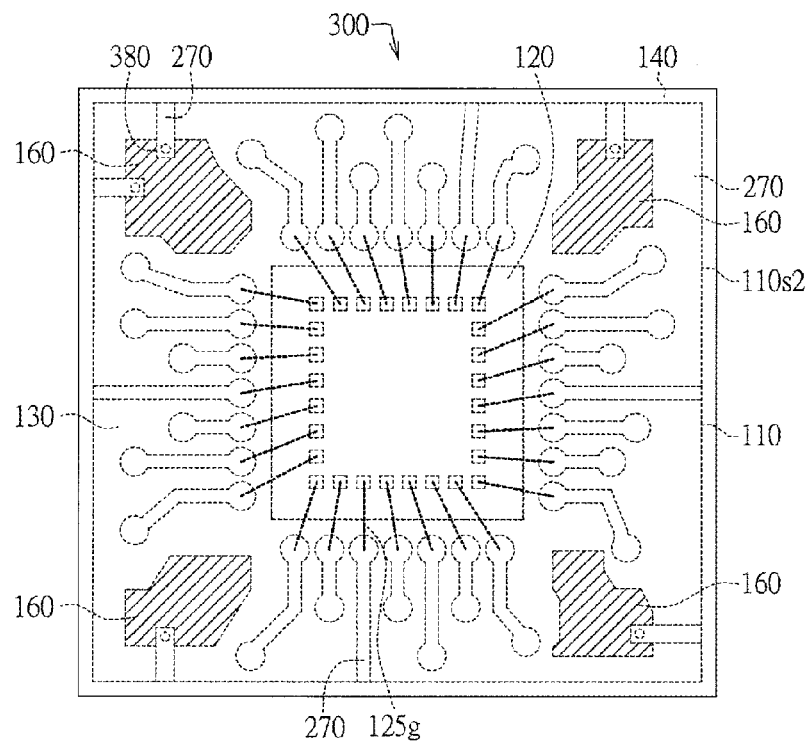
FIG. 3B is a top view of FIG. 3A.

FIG. 3B is a top view of FIG. 3A. The bonding wire 125 includes at least one grounding bonding wire 125g, and the grounding bonding wire 125g is electrically connected to the chip 120 and the grounding trace 270, so that the chip 120 may be grounded through the grounding bonding wire 125g, the grounding trace 270, and the shielding layer 140.

Figure 4A:
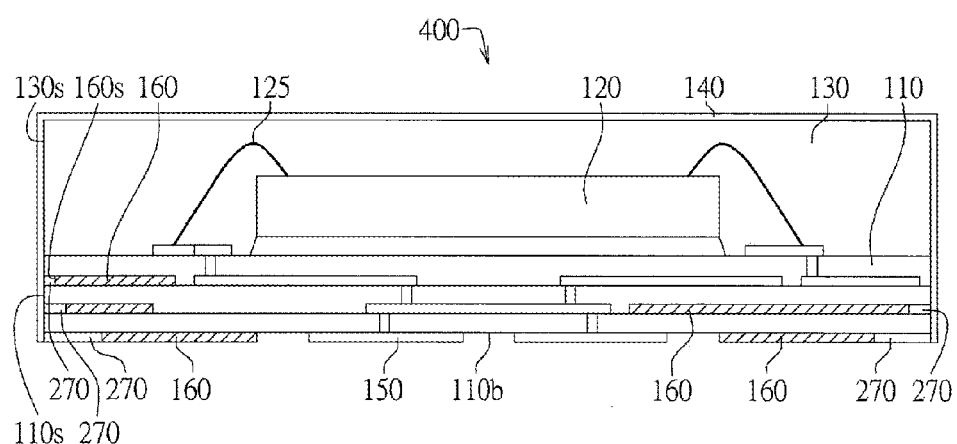
FIG. 4A is a sectional view of a semiconductor package according to another embodiment of the present disclosure.

FIG. 4A is a sectional view of a semiconductor package according to another embodiment of the present disclosure. A semiconductor package 400 includes a substrate 110, a chip 120, at least one bonding wire 125, a package body 130, a shielding layer 140, at least one electrical contact 150, at least one grounding layer 160, and at least one grounding trace 270.

In this embodiment, pads of the electrical contact 150 and the grounding layer 160 are formed on a bottom surface 110b of the substrate 110, so that the semiconductor package 400 is a land grid array (LGA) package. The grounding layer 160 is formed in, or included in, the substrate 110 and extends horizontally, and is separated from a lateral surface 110s of the substrate 110, that is, a lateral surface 160s of the grounding layer 160 is not exposed from, or on, the lateral surface 110s of the substrate 110. The grounding trace 270 is formed in, or included in, the substrate 110 and extends from the grounding layer 160 to the lateral surface 110s of the substrate 110 to be exposed at the lateral surface 110s of the substrate 110, so that the shielding layer 140 contacts the exposed grounding trace 270 to be grounded. In this example, there may be multiple grounding layers 160, which are formed on the bottom surface 110b of the substrate 110 and inside the substrate 110, respectively. In another example, at least one grounding layer 160 may be formed on at least one of the bottom surface 110b of the substrate 110, an upper surface 110u of the substrate 110, and inside the substrate 110; the number of layers and forming position of the grounding layer 160 are not limited in the embodiment of the present disclosure.

Figure 4B:
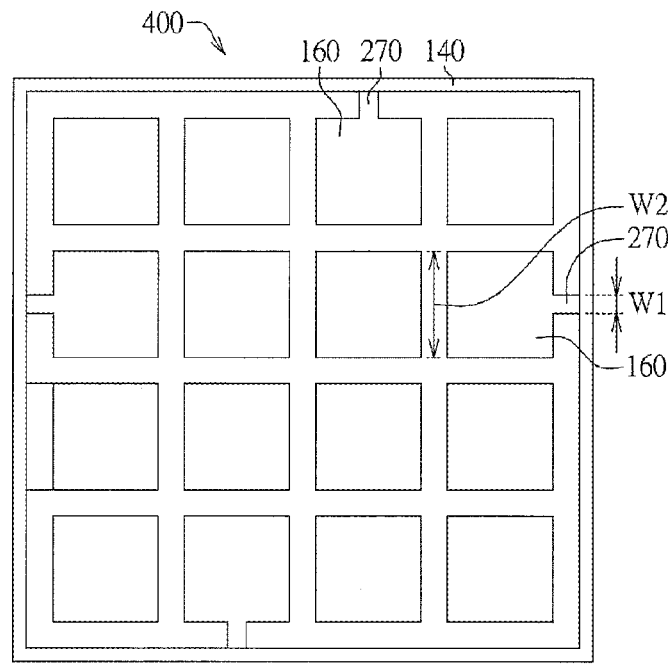
FIG. 4B is a bottom view of FIG. 4A.

FIG. 4B is a bottom view of FIG. 4A. A width W1 of the grounding trace 270 is smaller than a width W2 of the grounding layer 160. When the width W1 of the grounding trace 270 is adjusted to be smaller, the quality of grounding may become worse, but less material is used. When the width W1 of the grounding trace 270 is adjusted to be larger, the quality of grounding may become better, but more material is used. In an embodiment, a ratio of the width W1 to the width W2 is between about 5% and about 120%, such as between about 5% and about 50%, between about 50% and about 100%, or between about 100% and about 120%, so that a compromise is made between the quality of grounding and an allowed amount of material usage. However, to achieve a better quality of grounding, the width W1 of the grounding trace 270 may also be greater than the width W2 of the grounding layer 160.

Figure 5:
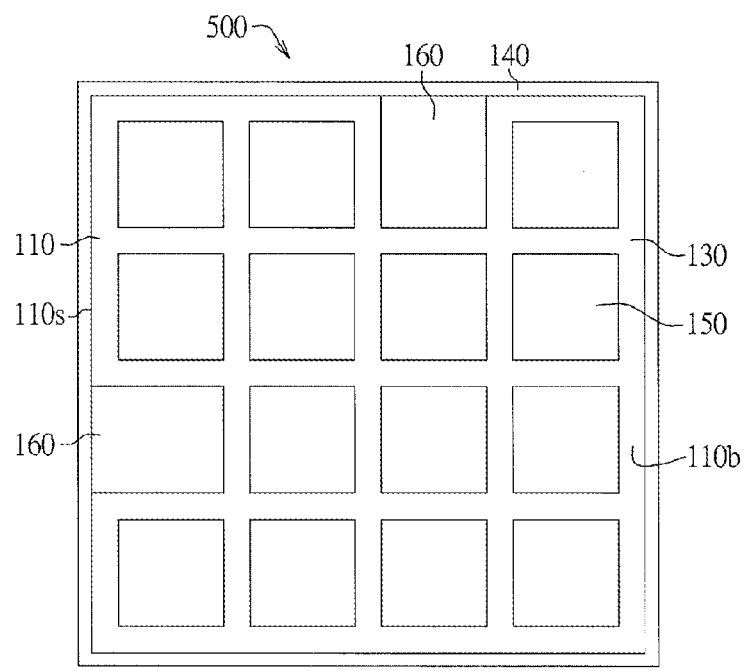
FIG. 5 is a bottom view of a semiconductor package according to another embodiment of the present disclosure.

FIG. 5 is a bottom view of a semiconductor package according to another embodiment of the present disclosure. A semiconductor package 500 includes a substrate 110, a chip 120 (not shown), at least one bonding wire 125 (not shown), a package body 130, a shielding layer 140, at least one electrical contact 150, and at least one grounding layer 160.

As shown in FIG. 5, the grounding layer 160 in this embodiment extends directly to a lateral surface 110s of the substrate 110, so as to increase an extending area of the grounding layer 160. Because the grounding layer 160 directly extends to the lateral surface 110s of the substrate 110, the grounding trace 270 may be omitted in this embodiment.

FIG. 6A to FIG. 6F are diagrams of a process of fabricating the semiconductor package in FIG. 1A.

Figure 6A:
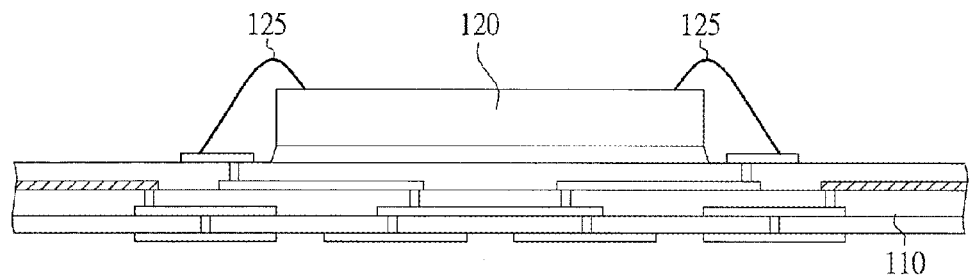
FIG. 6A, FIG. 6B, FIG. 6C, FIG. 6D, FIG. 6E, and FIG. 6F are diagrams of a process of fabricating the semiconductor package in FIG. 1A.

As shown in FIG. 6A, a substrate 110 is provided, where a chip 120 is provided on the substrate 110, and the chip 120 is electrically connected to the substrate 110 through at least one bonding wire 125. A grounding layer 160 is buried in the substrate 110, and extends horizontally, so as to produce a protection effect from electromagnetic interference for the chip 120.

Figure 6B:
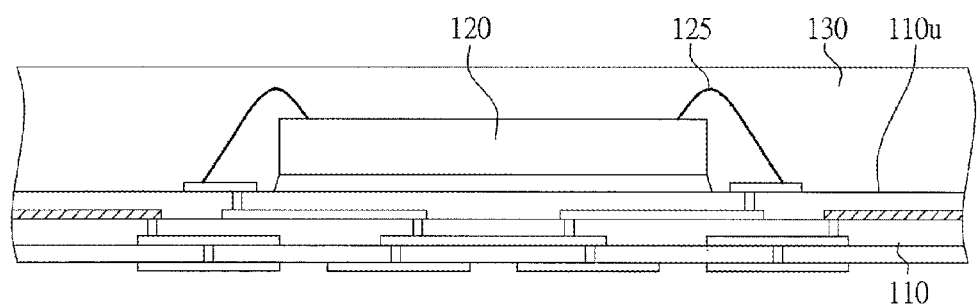

As shown in FIG. 6B, a package body 130 is formed to cover an upper surface 110u of the substrate 110 and to envelop the chip 120 and the bonding wire 125.

Figure 6C:
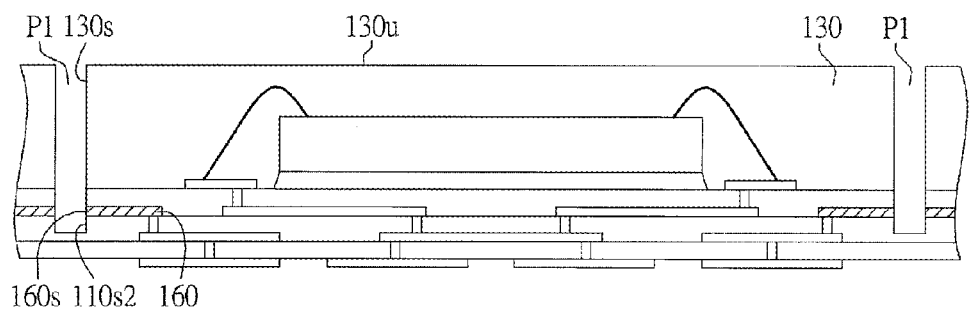

As shown in FIG. 6C, at least one first scribe line P1 may be formed by using, for example, a laser light or a cutter to pass through the package body 130, a part of the substrate 110, and the grounding layer 160, so that a lateral surface 130s, a second lateral surface 110s2, and a lateral surface 160s are formed for the package body 130, the substrate 110, and the grounding layer 160, respectively, where the lateral surface 160s of the grounding layer 160 is exposed from, or on, the second lateral surface 110s2 of the substrate 110. Because the lateral surface 130s, the second lateral surface 110s2, and the lateral surface 160s are formed in the same cutting operation, the lateral surface 130s, the second lateral surface 110s2, and the lateral surface 160s are aligned, for example, approximately aligned or flush.

Figure 6D:
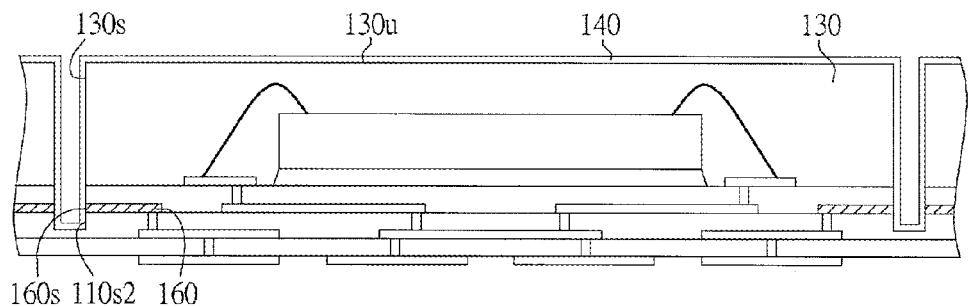

As shown in FIG. 6D, a shielding layer 140 may be formed by using, for example, CVD, electroless plating, electroplating, printing, spinning, spraying, sputtering or vacuum deposition to cover the lateral surface 130s and an upper surface 130u of the package body 130, the second lateral surface 110s2 of the substrate 110, and the exposed lateral surface 160s of the grounding layer 160.

Figure 6E:
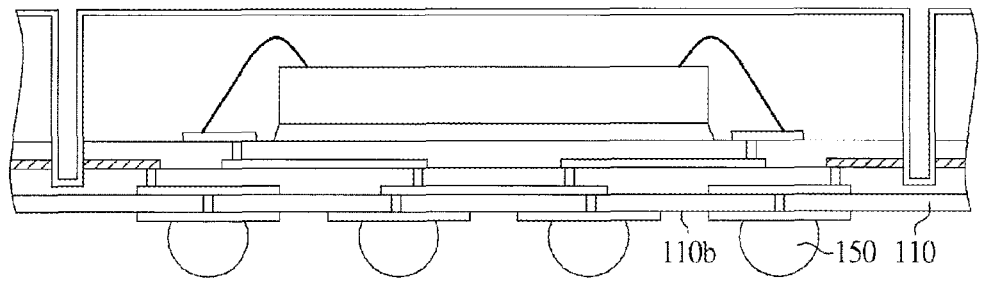

As shown in FIG. 6E, at least one electrical contact 150 is formed on a bottom surface 110b of the substrate 110.

Figure 6F:
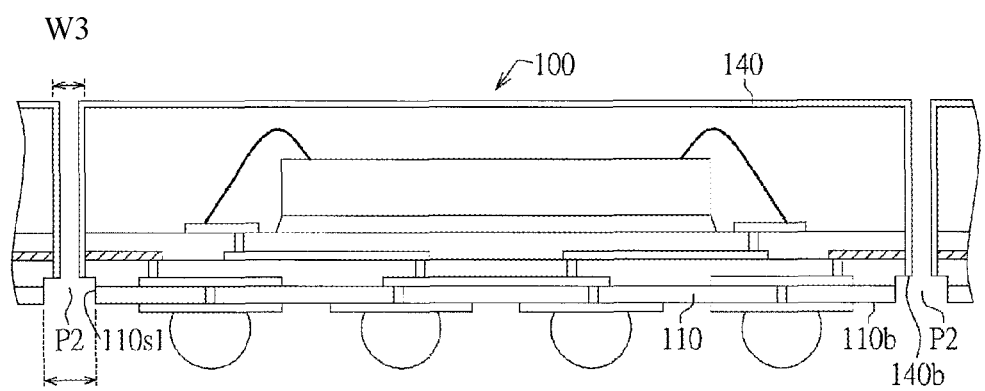

As shown in FIG. 6F, at least one second scribe line P2 may be formed by using, for example, a cutter or a laser light from the bottom surface 110b of the substrate 110 to pass through the remaining part of the substrate 110, so as to cut through the substrate 110. Such a cutting manner is referred to as half-cut. After cutting, a first lateral surface 110s1 is formed for the substrate 110. Because a width W4 of the second scribe line P2 is greater than a width W3 of the first scribe line P1, the first lateral surface 110s1 is concave or inwardly recessed relative to the second lateral surface 110s2. After cutting, a bottom surface 140b is formed for the shielding layer 140, where the bottom surface 140b of the shielding layer 140 is separated from the bottom surface 110b of the substrate 110, that is, the bottom surface 140b of the shielding layer 140 is away from the bottom surface 110b of the substrate 110 by a distance along a thickness direction of the substrate 110. In addition, before the second scribe line P2 is formed, the substrate 110 and the package body 130 may be inverted first, so that the substrate 110 faces towards the cutter or the laser light for ease of cutting.

The method of fabricating the semiconductor package 200 in FIG. 2 is similar to that of the semiconductor package 100, which is not further elaborated here. The difference between the method of fabricating the semiconductor package 300 and the method of fabricating the semiconductor package 100 lies in that, in the method of fabricating the semiconductor package 300, the formation of the second scribe line P2 may be omitted, and the first scribe line P1 passes through the entire package body 130 and the entire substrate 110, so as to completely cut through the package body 130 and the substrate 110. The methods of fabricating the semiconductor packages 400 and 500 are similar to those of fabricating the semiconductor package 300, which are not further elaborated here.

Figure 7:
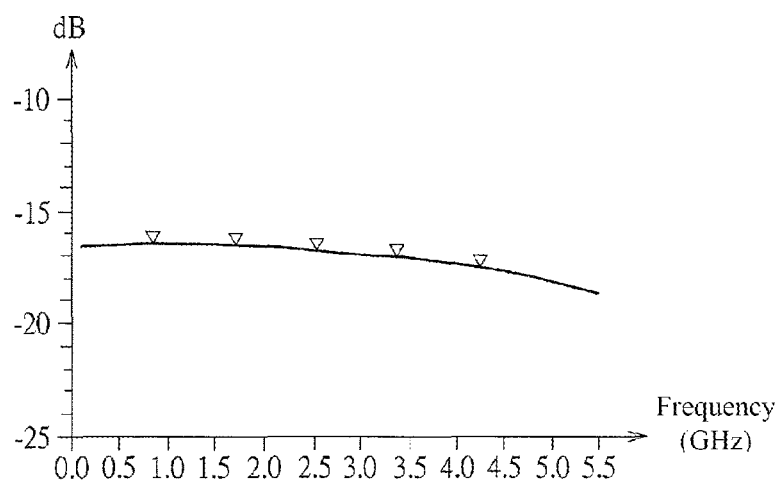
FIG. 7, FIG. 8, FIG. 9, FIG. 10, FIG. 11, FIG. 12, FIG. 13, FIG. 14, and FIG. 15 are diagrams of test results for the semiconductor packages according to the foregoing embodiment of the present disclosure.
Figure 8:
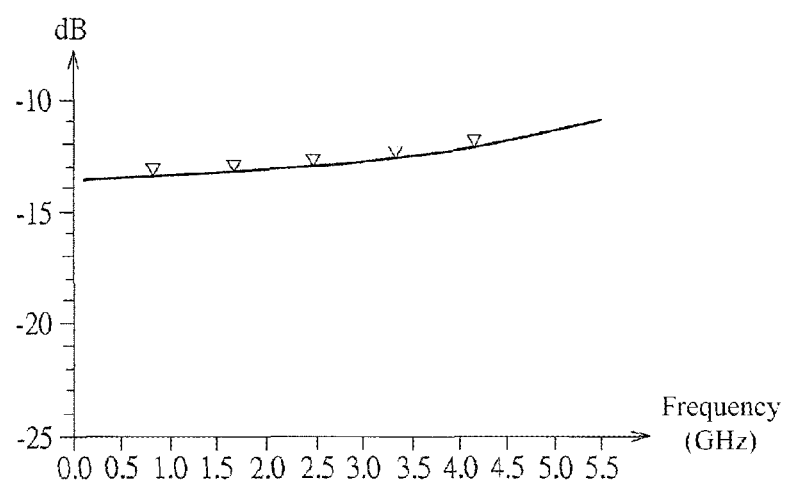
Figure 9:
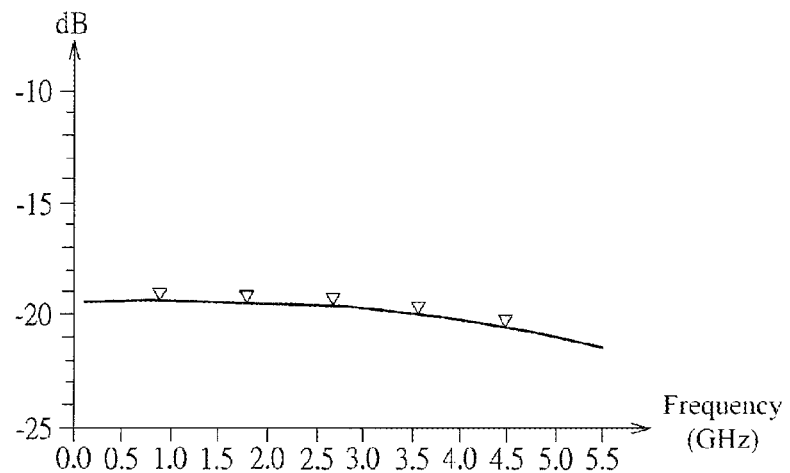
Figure 10:
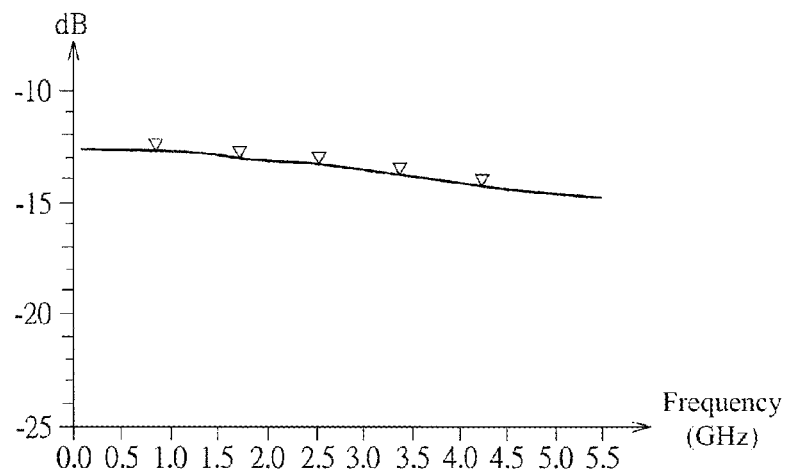
Figure 11:
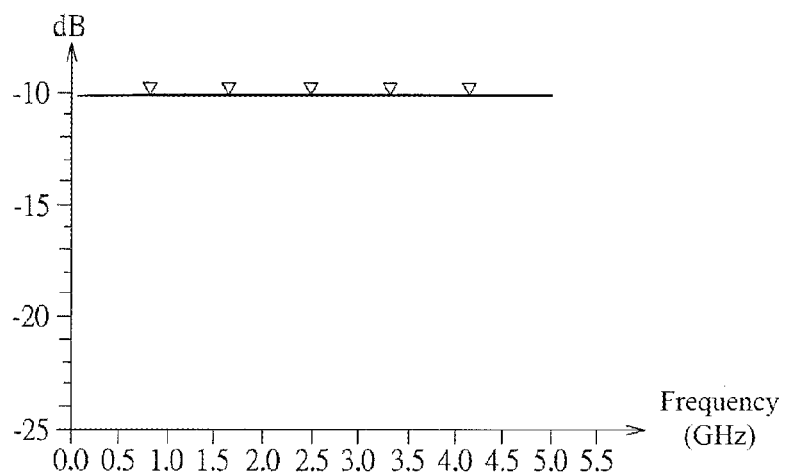
Figure 12:
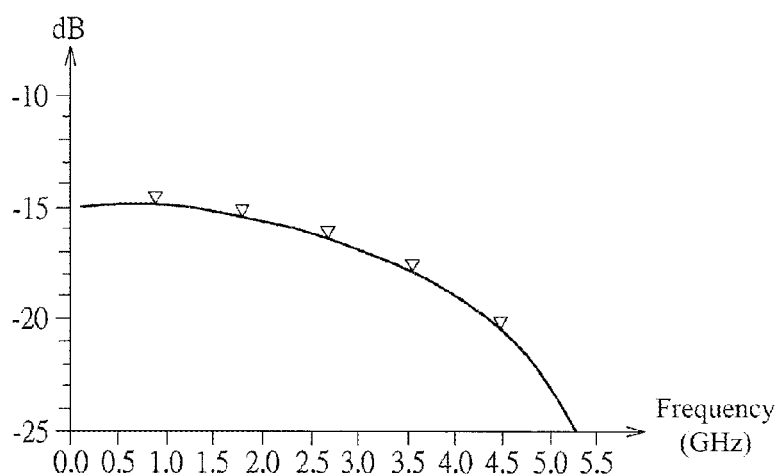
Figure 13:
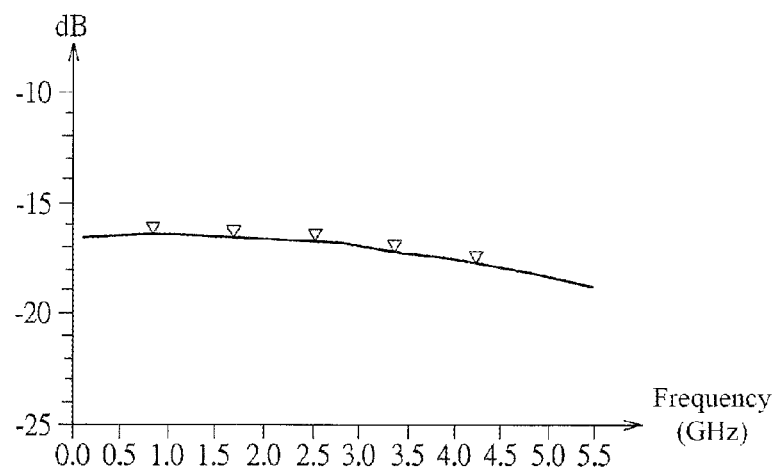
Figure 14:
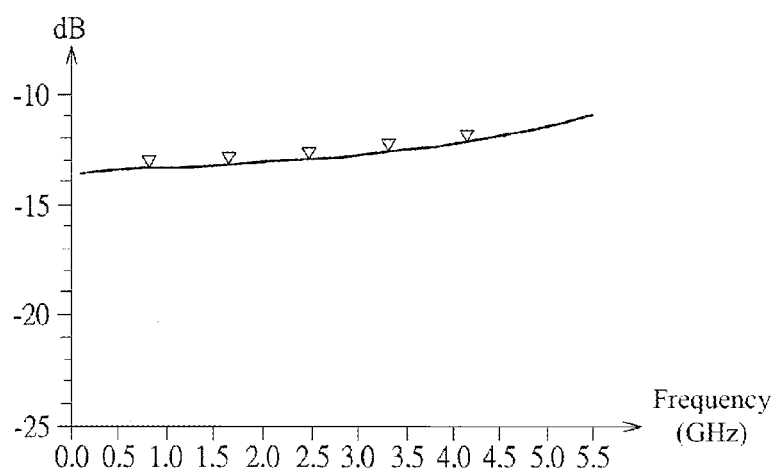
Figure 15:
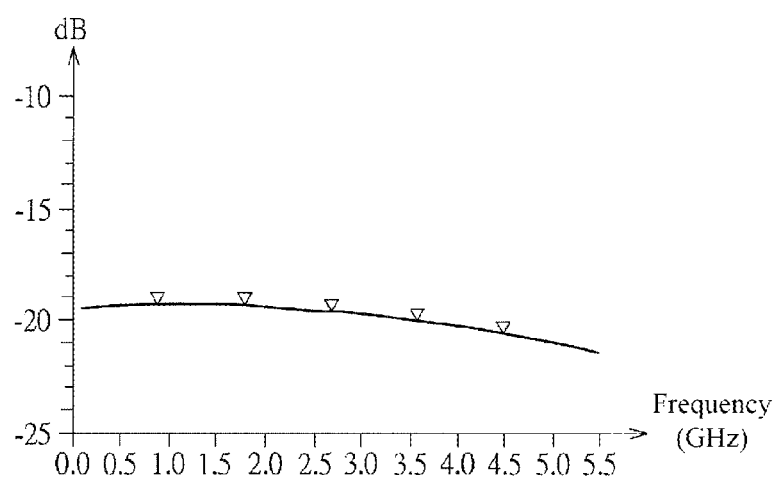

FIG. 7 to FIG. 15 are diagrams of test results for the semiconductor packages in the foregoing embodiments of the present disclosure. FIG. 7 to FIG. 9 are test results of electromagnetic interference protection of multiple grounding layers 160 being formed both inside the substrate 110 and on the bottom surface 110b, where the substrate 110 in FIG. 7 has the highest circuit density, that in FIG. 8 has an intermediate circuit density, and that in FIG. 9 has the lowest. FIG. 10 to FIG. 12 are test results of electromagnetic interference protection of the grounding layer 160 being solely formed inside the substrate 110, where the substrate 110 in FIG. 10 has the highest circuit density, that in FIG. 11 has an intermediate circuit density, and that in FIG. 12 has the lowest. FIG. 13 to FIG. 15 are test results of electromagnetic interference protection of the grounding layer 160 being solely formed on the bottom surface 110b of the substrate 110, where the substrate 110 in FIG. 13 has the highest circuit density, that in FIG. 14 has an intermediate circuit density, and that in FIG. 15 has the lowest. The horizontal axis is an operation frequency, with the unit being GHz, and the vertical axis is an electromagnetic interference protection effect, with the unit being dB.

As can be seen from the foregoing test results, the electromagnetic interference protection effect when the grounding layers 160 are formed inside the substrate 110 and on the bottom surface 110b at the same time is close to the electromagnetic interference protection effect when the grounding layer 160 is solely formed on the bottom surface 110b of the substrate 110. In addition, compared with the electromagnetic interference protection effect when the grounding layer 160 is solely formed inside the substrate 110, the electromagnetic interference protection effect when the grounding layers 160 are formed inside the substrate 110 and on the bottom surface 110b at the same time and the electromagnetic interference protection effect when the grounding layer 160 is solely formed on the bottom surface 110b of the substrate 110 are both more desirable.

LIST OF REFERENCE NUMERALS 100, 200, 300, 400, 500: Semiconductor package
110: Substrate
110s1: First lateral surface
110s2: Second lateral surface
110b: Bottom surface
110u, 130u: Upper surface
120: Chip
125: Bonding wire
130: Package body
130s, 160s: Lateral surface
140: Shielding layer
140b: Bottom surface
150: Electrical contact
151: Grounding contact
160: Grounding layer
270: Grounding trace
380: Via
W1, W2, W3, W4: Width As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a range of between about 5 micrometers and about 50 micrometers should be understood to include the explicitly recited limits of about 5 micrometers and about 50 micrometers, but also to include individual values such as about 10 micrometers, about 20 micrometers, and about 30 micrometers, and subranges such as about 5 micrometers to about 20 micrometers or about 20 micrometers to about 50 micrometers.

In conclusion, the present disclosure has been disclosed above through the embodiments, but is not intended to be limited thereto. Various variations and modifications may be made by persons skilled in the art without departing from the spirit and scope of the present disclosure. Therefore, the protection scope of the present disclosure is as defined by the appended claims.

What is claimed is:

1. A semiconductor package, comprising:
    a substrate including a lateral surface and a bottom surface;
    a grounding layer buried in the substrate and extending horizontally in the substrate, wherein the grounding layer is separated from the lateral surface of the substrate;
    a grounding trace extending to the lateral surface of the substrate, wherein the grounding trace and the grounding layer are disposed on different layers of the substrate;
    a via formed between the grounding trace and the grounding layer to electrically connect the grounding trace and the grounding layer;
    a chip arranged on the substrate;
    a package body enveloping the chip and including a lateral surface; and
    a shielding layer covering the lateral surface of the package body and the lateral surface of the substrate, and electrically connected to the grounding layer, wherein a bottom surface of the shielding layer is separated from the bottom surface of the substrate.

2. The semiconductor package according to claim 1, wherein the grounding trace extends from the grounding layer to the lateral surface of the substrate.

3. The semiconductor package according to claim 1, further comprising:
    a plurality of grounding layers buried in the substrate.

4. The semiconductor package according to claim 1, wherein a horizontal area of the grounding layer is 5% to 50% of a horizontal area of the substrate.

5. The semiconductor package according to claim 1, wherein a vertical thickness of the grounding layer is between 5 micrometers and 50 micrometers.

6. A semiconductor package, comprising:
    a substrate including a lateral surface;
    a grounding layer included in the substrate, the grounding layer extending horizontally and being separated from the lateral surface of the substrate;
    a grounding trace included in the substrate, and extending from the grounding layer to the lateral surface of the substrate to be exposed on the lateral surface of the substrate, wherein a width of the grounding trace is smaller than a width of the grounding layer;
    a chip arranged on the substrate;
    a package body enveloping the chip and including a lateral surface; and
    a shielding layer covering the lateral surface of the package body, the lateral surface of the substrate, and the exposed grounding trace.

7. The semiconductor package according to claim 6, wherein the substrate has a bottom surface, and the grounding layer is formed on the bottom surface of the substrate.

8. The semiconductor package according to claim 6, wherein the grounding layer is buried in the substrate.

9. The semiconductor package according to claim 6, wherein the grounding trace includes a lateral surface exposed on the lateral surface of the substrate, and the lateral surface of the package body, the lateral surface of the substrate, and the lateral surface of the grounding trace are aligned.

10. The semiconductor package according to claim 6, further comprising:
    a plurality of grounding layers included in the substrate; and
    a plurality of grounding traces included in the substrate, each grounding trace extends from a corresponding grounding layer to the lateral surface of the substrate.

11. The semiconductor package according to claim 6, wherein a sum of horizontal areas of the grounding layer and the grounding trace is 5% to 50% of a horizontal area of the substrate.

12. The semiconductor package according to claim 6, wherein a vertical thickness of each of the grounding layer and the grounding trace is between 5 micrometers and 50 micrometers.

13. The semiconductor package according to claim 6, wherein the grounding layer includes a lateral surface exposed on the lateral surface of the substrate, and the lateral surface of the package body, the lateral surface of the substrate, and the lateral surface of the grounding layer are aligned.

14. A semiconductor package, comprising:
    a substrate;
    a plurality of grounding layers in the substrate;
    a chip positioned on the substrate and electrically connected to the substrate;
    a package body encapsulating the chip and the substrate, the package body having a top surface and a plurality of side surfaces; and
    a shielding layer covering the top surface of the package body and extending down each side surface of the package body;
    wherein the shielding layer physically contacts a first one of the plurality of grounding layers and electrically connects to a second one of the plurality of grounding layers; and
    wherein a third one of the plurality of grounding layers is formed on an upper surface of the substrate.

15. The semiconductor package according to claim 14, wherein the third one of the plurality of grounding layers physically contacts the shielding layer at a side surface of the package body.

16. The semiconductor package according to claim 14, further comprising at least one trace physically connected between the third one of the plurality of grounding layers and the shielding layer.

17. The semiconductor package according to claim 14, further comprising a plurality of electrical contact pads formed on the bottom surface of the substrate, wherein the semiconductor package is a land grid array package, and the second one of the plurality of grounding layers is formed on a bottom surface of the substrate.

* * * * *